US009356055B2

(12) United States Patent
Xu et al.

(10) Patent No.: US 9,356,055 B2
(45) Date of Patent: May 31, 2016

(54) ARRAY SUBSTRATE AND METHOD FOR FABRICATING THE SAME, AND DISPLAY DEVICE

(71) Applicant: BOE TECHNOLOGY GROUP CO., LTD., Beijing (CN)

(72) Inventors: Chuanxiang Xu, Beijing (CN); Shi Shu, Beijing (CN); Yonglian Qi, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/447,928

(22) Filed: Jul. 31, 2014

(65) Prior Publication Data

US 2015/0236056 A1 Aug. 20, 2015

(30) Foreign Application Priority Data

Feb. 20, 2014 (CN) .......................... 2014 1 0058912

(51) Int. Cl.
*H01L 27/12* (2006.01)
(52) U.S. Cl.
CPC .......... *H01L 27/1262* (2013.01); *H01L 27/124* (2013.01)
(58) Field of Classification Search
CPC .............. H01L 21/283; H01L 29/1033; H01L 27/1288; H01L 27/1259; H01L 27/124; H01L 23/3171; H01L 29/4175; H01L 29/78696; H01L 27/1248; H01L 21/32133; H01L 29/41733; G02F 1/1368; G02F 1/1362
See application file for complete search history.

(56) References Cited

U.S. PATENT DOCUMENTS

| 6,330,043 | B1 * | 12/2001 | Kikkawa | ........... G02F 1/136227 349/106 |
| 7,312,840 | B1 | 12/2007 | Sakamoto | |
| 2003/0013236 | A1 * | 1/2003 | Nakata | .............. G02F 1/136227 438/149 |
| 2004/0119903 | A1 | 6/2004 | Chang et al. | |
| 2014/0183535 | A1 * | 7/2014 | Choi et al. | ...................... 257/59 |

FOREIGN PATENT DOCUMENTS

CN 103325732 A 9/2013

OTHER PUBLICATIONS

Office Action dated Nov. 25, 2015 issued in corresponding Chinese Application No. 201410058912.4.

* cited by examiner

*Primary Examiner* — Roy Potter
*Assistant Examiner* — Paul Patton
(74) *Attorney, Agent, or Firm* — Nath, Goldberg & Meyer; Joshua B. Goldberg; Christopher Thomas (57) ABSTRACT

The present invention discloses an array substrate and a manufacturing method for the same, and a display device. By adopting the manufacturing method for the array substrate provided by the embodiments of the present invention, via holes with relatively small hole sizes in a color resin layer are realized, so that the aperture ratio of pixels is improved. The manufacturing method for the array substrate includes: forming thin film transistors on a substrate; forming a color resin layer on the substrate on which the thin film transistors are formed; forming a first light-blocking layer with a light-shielding effect on the color resin layer, the photolithographic resolution of the first light-blocking layer being greater than that of the color resin layer; and performing a patterning process on the first light-blocking layer and the color resin layer to form via holes in the color resin layer.

11 Claims, 5 Drawing Sheets

ARRAY SUBSTRATE AND METHOD FOR FABRICATING THE SAME, AND DISPLAY DEVICE

FIELD OF THE INVENTION

The present invention relates to the field of display technology, and particularly relates to an array substrate and a manufacturing method for the same and a display device.

BACKGROUND OF THE INVENTION

In the field of liquid crystal display technology, a liquid crystal display panel mainly includes a color filter substrate and an array substrate which are arranged in a cell aligning manner. The color filter substrate is mainly provided with a color filter (namely a color resin layer) thereon, the array substrate is mainly provided with a pixel array thereon, each pixel unit in the pixel array is correspondingly provided with a thin film transistor (TFT) functioning as a switch, and the drain of the TFT is connected with a pixel electrode in the pixel unit to provide a gray-scale voltage for the pixel electrode so as to realize image display.

In recent years, with continual requirements of people for display panels with high aperture ratio and high brightness, a technology of directly forming a color filter on array (COA) is developed, and the COA technology can improve the aperture ratio, reduce the cost and improve the display quality of a product by reducing the error between the array substrate and the color filter substrate during cell forming.

A color filter on array substrate (namely COA substrate) formed through the COA technology in the prior art includes pixel units distributed in an array manner, wherein each pixel unit includes a TFT, a color resin layer and a pixel electrode, and the pixel electrode is electrically connected with the drain electrode of the TFT through a via hole on the color resin layer. When the via hole on the color resin layer is made in the prior art, it is obtained by directly exposing and developing the color resin layer using a mask. However, the resolution of the color resin layer is generally low, and the minimum critical dimension (CD) or hole size (Hole Size) realized after the color resin layer is exposed and developed is relatively large, so that the aperture ratio of pixels is affected.

SUMMARY OF THE INVENTION

Embodiments of the present invention provide an array substrate and a manufacturing method for the same, and a display device. By adopting the manufacturing method for the array substrate provided by the embodiments of the present invention, via holes with relatively small hole sizes in a color resin layer are realized, so that the aperture ratio of pixels is improved.

To fulfill the above-mentioned purpose, an embodiment of the present invention provides a manufacturing method for an array substrate, including:
  forming thin film transistors on a substrate;
  forming a color resin layer on the substrate on which the thin film transistors are formed;
  forming a first light-blocking layer with a light-shielding effect on the color resin layer, the photolithographic resolution of the first light-blocking layer being greater than that of the color resin layer; and
  performing a patterning process on the first light-blocking layer and the color resin layer to form via holes in the color resin layer.

Preferably, after the via holes are formed, the method further includes:
  forming pixel electrodes on the color resin layer in which the via holes are formed, the pixel electrodes being connected with the drain electrodes of the thin film transistors via the corresponding via holes.

Preferably, after the via holes are formed and before the pixel electrodes are formed, the method further includes:
  removing the first light-blocking layer on the color resin layer through a dry etching method.

Preferably, after the color resin layer is formed on the substrate and before the first light-blocking layer is formed, the method further includes:
  forming a second light-blocking layer which may be peeled off by adopting a peeling-off solution on the substrate on which the thin film transistors and the color resin layer are formed.

Preferably, the first light-blocking layer is a black resin layer, and the second light-blocking layer is a photoresist layer.

Preferably, the photoresist layer is a negative photoresist layer.

Preferably, after the via holes are formed on the color resin layer and before the pixel electrodes are formed, the method further includes:
  peeling off the photoresist layer and the color resin layer by adopting the peeling-off solution.

Preferably, the step of sequentially performing the patterning process on the first light-blocking layer and the color resin layer to form the via holes in the color resin layer includes:
  placing a mask plate on the first light-blocking layer, wherein areas in which the via holes are to be formed on the first light-blocking layer correspond to light-tight areas of the mask plate, and the rest areas of the first light-blocking layer correspond to euphotic area of the mask plate; exposing the first light-blocking layer, and sequentially developing the first light-blocking layer and the color resin layer to develop the areas on the first light-blocking layer and the color resin layer corresponding to the via holes to be formed, thus forming the via holes penetrating through the first light-blocking layer and the color resin layer.

Preferably, the step of sequentially performing the patterning process on the first light-blocking layer and the color resin layer to form the via holes in the color resin layer includes:
  placing a mask plate on the first light-blocking layer, wherein areas in which the via holes are to be formed on the first light-blocking layer correspond to light-tight areas of the mask plate, and the rest areas of the first light-blocking layer correspond to euphotic areas of the mask plate;
  exposing the first light-blocking layer and the second photoresist layer, and sequentially developing the first light-blocking layer, the second light-blocking layer and the color resin layer till the areas on the first light-blocking layer, the second light-blocking layer and the color resin layer corresponding to the via holes to be formed are developed off, thus forming the via holes penetrating through the first light-blocking layer, the second light-blocking layer and the color resin layer.

An embodiment of the present invention provides another array substrate, which is manufactured by adopting the above-mentioned manufacturing method for the array substrate.

An embodiment of the present invention further provides a display device, including the above-mentioned array substrate.

In conclusion, the embodiments of the present invention provide the manufacturing method for the array substrate, that is, the thin film transistors are formed on the substrate; the color resin layer is formed on the substrate on which the thin film transistors are formed; then the first light-blocking layer is formed on the substrate on which the thin film transistors and the color resin layer are formed; the patterning process is at least performed on the first light-blocking layer and the color resin layer to form the via holes penetrating the first light-blocking layer and the color resin layer, and the photolithographic resolution of the first light-blocking layer is greater than that of the color resin layer. The present invention is proposed on the basis of the following facts, that is, on the premise of identical exposure equipment and exposure parameters, the minimum critical dimension (CD) or hole size realized after the first light-blocking layer is exposed and developed is smaller than that realized after the color resin layer is exposed and developed. In the present invention, the first light-blocking layer is positioned on the color resin layer and is exposed, the first light-blocking layer and the color resin layer are developed sequentially according to the exposure pattern, relatively small via holes are first formed on the first light-blocking layer, and the via holes of which the size is similar to that of the via holes on the first light-blocking layer are formed on the color resin layer. The hole size of the via holes formed through the method on the color resin layer is relatively small, so that the aperture ratio of pixels on the array substrate is improved.

DETAILED DESCRIPTION OF THE EMBODIMENTS

Embodiments of the present invention provide an array substrate and a manufacturing method for the same, and a display device. By adopting the manufacturing method for the array substrate provided by the embodiment of the present invention, via holes with relatively small hole sizes in a color resin layer are realized, so that the aperture ratio of pixels is improved.

It should be noted that, the principle of a development process is to dissolve resin with a developing solution of certain concentration. A black resin layer, a color resin layer and a photoresist layer of the present invention below may be developed off by the developing solution.

The black resin layer mainly includes an alkali-soluble resin, a black pigment and a photo-polymerization initiator. The color resin layer mainly includes an alkali-soluble resin, a color pigment and a photo-polymerization initiator.

The technical solutions provided by the embodiments of the present invention will be illustrated in detail below in conjunction with the accompanying drawings.

Figure 1:
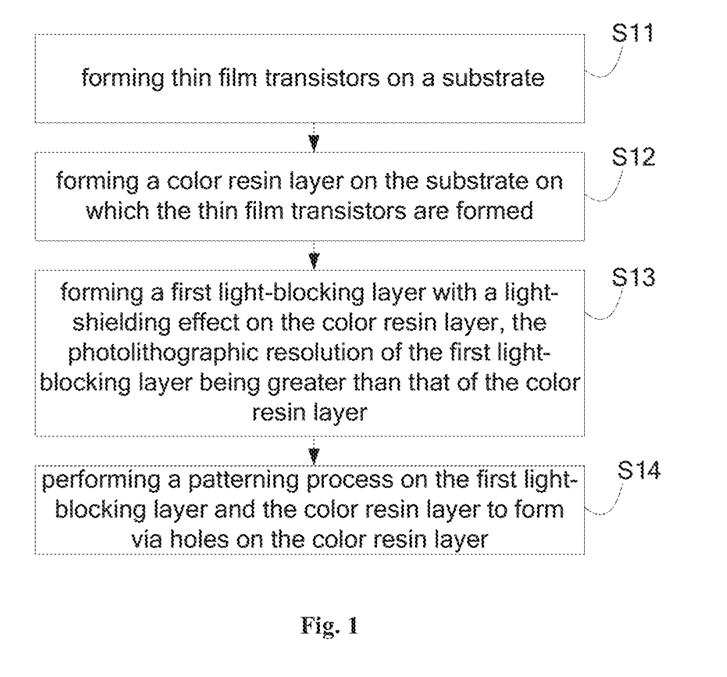
FIG. 1 is a flow schematic diagram of a manufacturing method for an array substrate provided by embodiment 1 of the present invention.

See FIG. 1, a manufacturing method for an array substrate provided by an embodiment of the present invention, mainly includes the following steps:

S11, forming thin film transistors on a substrate;

S12, forming a color resin layer on the substrate on which the thin film transistors are formed;

S13, forming a first light-blocking layer with a light-shielding effect on the color resin layer, wherein the photolithographic resolution of the first light-blocking layer is greater than that of the color resin layer;

the photolithographic resolution indicates the minimum critical dimension (CD) or hole size of a material after exposure and developing, and is at least determined by the resolution (precision) of an exposure machine and the resolution (related to properties) of the material. Under the condition that the exposure machine is definite, the photolithographic resolution is only related to the resolution of the material to be exposed.

The photolithographic resolution of the first light-blocking layer is greater than that of the color resin layer in the present invention.

S14, performing a patterning process on the first light-blocking layer and the color resin layer to form via holes in the color resin layer.

Further, the manufacturing method for the array substrate provided by the embodiment of the present invention also includes: in the forming process of pixel electrodes, the pixel electrodes are used for being connected with the drain electrodes of the thin film transistors.

A preferred implementation is:

after step S14, the pixel electrodes are formed on the color resin layer in which the via holes are formed, wherein the pixel electrodes are connected with the drain electrodes of the thin film transistors via the corresponding via holes.

The above-mentioned manufacturing method for the array substrate at least includes two implementations:

I, the patterning process is directly performed on the first light-blocking layer and the color resin layer, and the via holes in the color resin layer are formed through the first light-blocking layer. II, before the first light-blocking layer is formed, a second light-blocking layer which may be peeled off by adopting a peeling-off solution is formed on the color resin layer. The patterning process is performed on the first light-blocking layer, the second light-blocking layer and the color resin layer, and the via holes in the color resin layer are formed through the first light-blocking layer and the second photoresist layer.

The above-mentioned two implementations will be illustrated below respectively.

Embodiment 1

Preferably, the patterning process is sequentially performed on the first light-blocking layer and the color resin layer, and the via holes are formed in the color resin layer, specifically:

placing a mask plate on the first light-blocking layer, wherein areas in which the via holes are to be formed on the first light-blocking layer correspond to light-tight areas of the mask plate, and the rest areas of the first light-blocking layer correspond to a euphotic area of the mask plate; exposing the first light-blocking layer, sequentially developing the first light-blocking layer and the color resin layer to develop the areas on the first light-blocking layer and the color resin layer corresponding to the via holes to be formed, and forming the via holes penetrating through the first light-blocking layer and the color resin layer.

Preferably, the first light-blocking layer is a black resin layer.

Preferably, after the via holes are formed in the color resin layer and before the pixel electrodes are formed, the method further includes:

removing the black resin layer on the color resin layer by a dry etching method, specifically.

According to the above-mentioned manufacturing method for the array substrate provided by embodiment 1, on the premise of identical exposure equipment and exposure parameters, the minimum critical dimension (CD) or hole size realized after the first light-blocking layer is exposed and developed is smaller than that realized after the color resin layer is exposed and developed. In the present invention, the first light-blocking layer is positioned on the color resin layer and is exposed to form an exposure pattern, the first light-blocking layer and the color resin layer are developed sequentially according to the exposure pattern, relatively small via holes are first formed on the first light-blocking layer, and the via holes of which the size is similar to that of the via holes on the first light-blocking layer are formed on the color resin layer. The hole size of the via holes formed through the method on the color resin layer is relatively small, so that the aperture ratio of pixels on the array substrate is improved.

Embodiment 2

After the color resin layer is formed on the substrate in step S12 and before the first light-blocking layer is formed in step S13, the method further includes:

forming a second light-blocking layer which may be peeled off by adopting a peeling-off solution on the substrate on which the thin film transistors and the color resin layer are formed, preferably, the first light-blocking layer being a black resin layer, and the second light-blocking layer being a photoresist layer.

Further, the photoresist layer is a negative photoresist layer.

Further, after the via holes are formed in the color resin layer and before the pixel electrodes are formed, the method further includes:

peeling off the photoresist layer and the color resin layer by adopting the peeling-off solution.

With respect to the black resin layer and the negative photoresist layer, the sequentially performing the patterning process on the first light-blocking layer and the color resin layer to form the via holes in the color resin layer includes:

placing a mask plate on the black resin layer, wherein areas in which the via holes are to be formed on the black resin layer correspond to light-tight areas of the mask plate, and the rest areas of the black resin layer correspond to euphotic areas of the mask plate; and exposing the black resin layer and the photoresist layer, and sequentially developing the black resin layer, the photoresist layer and the color resin layer till the areas corresponding to the via holes to be formed in the black resin layer, the photoresist layer and the color resin layer are developed off, thus forming the via holes penetrating through the black resin layer, the photoresist layer and the color resin layer.

Of course, the mask plate may also be placed on the black resin layer, so that the areas in which the via holes are to be formed on the black resin layer correspond to the euphotic areas of the mask plate, and the rest areas of the black resin layer correspond to the light-tight areas of the mask plate. The material of the black resin layer ensures that the euphotic area may be developed off, and the light-tight area may not be developed off.

It will be specifically illustrated below in conjunction with the accompanying drawings.

Figure 2:
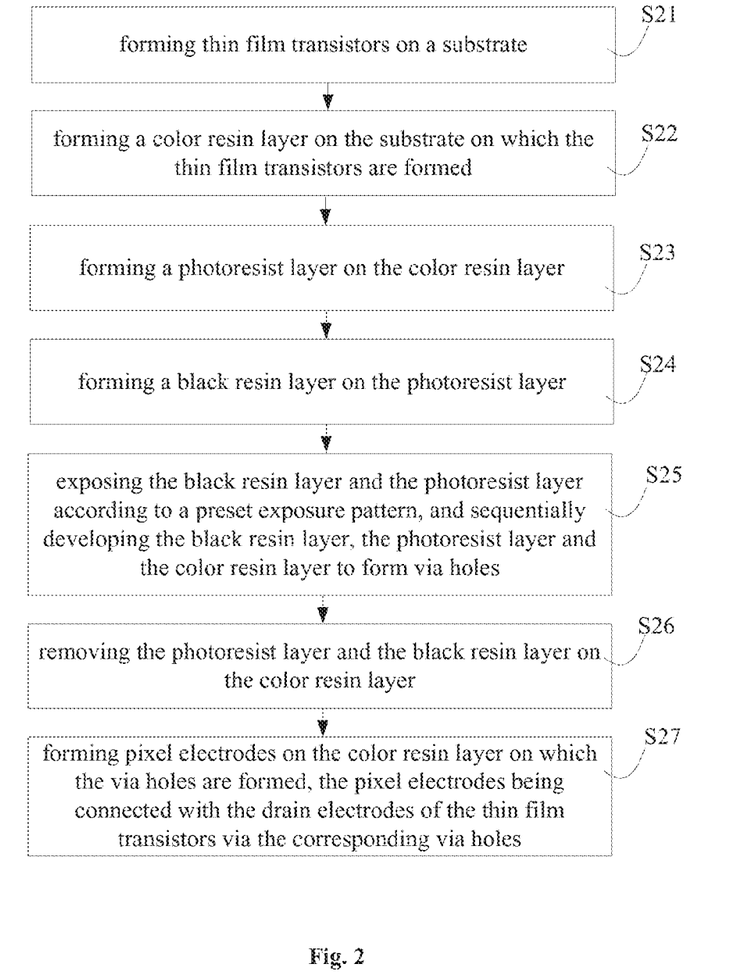
FIG. 2 is a flow schematic diagram of a manufacturing method for an array substrate provided by embodiment 2 of the present invention.

See FIG. 2, a manufacturing method for an array substrate provided by embodiment 2 of the present invention mainly includes the following steps:

S21, forming thin film transistors on a substrate;

S22, forming a color resin layer on the substrate on which the thin film transistors are formed;

S23, forming a photoresist layer on the color resin layer;

S24, forming a black resin layer on the photoresist layer;

S25, exposing the black resin layer and the photoresist layer according to a preset exposure pattern, and sequentially developing the black resin layer, the photoresist layer and the color resin layer to form via holes penetrating through the black resin layer, the photoresist layer and the color resin layer;

S26, removing the photoresist layer and the black resin layer on the color resin layer; and S27, forming pixel electrodes on the color resin layer on which the via holes are formed, the pixel electrodes being connected with the drain electrodes of the thin film transistors via the corresponding via holes.

The photoresist layer may be a positive photoresist layer or a negative photoresist layer. When the photoresist layer is the positive photoresist layer, the area irradiated by light is easily developed off. When the photoresist layer is the negative photoresist layer, the area which is not irradiated by the light is easily developed off.

Since the area which needs to be developed in the present invention is a small-area via hole area, the quality of the via holes obtained by setting the situation that the photoresist area corresponding to the via holes corresponds to the light-shielding area of the mask plate is relatively good. Preferably, the photoresist layer is the negative photoresist layer.

Preferably, when the photoresist layer is arranged on the color resin layer, the removing the photoresist layer and the black resin layer on the color resin layer specifically includes:

separating the photoresist layer from the color resin layer by adopting a peeling-off solution, and separating the black resin layer from the color resin layer when the photoresist layer is separated from the color resin layer, so that no photoresist layer and black resin layer exist on the color resin layer of the array substrate.

Based on the above-mentioned embodiment, the exposing the black resin layer and the photoresist layer according to the preset exposure pattern and sequentially developing the black resin layer, the photoresist layer and the color resin layer to form the via holes penetrating through the black resin layer, the photoresist layer and the color resin layer specifically includes:

placing a mask plate on the black resin layer, wherein areas in which the via holes are to be formed on the black resin layer correspond to light-tight areas of the mask plate, and the rest areas of the black resin layer correspond to euphotic areas of the mask plate; and exposing the black resin layer and the photoresist layer, and sequentially developing the black resin layer, the photoresist layer and the color resin layer till the areas on the black resin layer, the photoresist layer and the color resin layer corresponding to the via holes to be formed are developed off, thus forming the via holes penetrating through the black resin layer, the photoresist layer and the color resin layer.

According to the above-mentioned manufacturing method for the array substrate provided by embodiment 2, on the premise of identical exposure equipment and exposure parameters, the minimum critical dimension (CD) or hole size realized after the black resin layer is exposed and developed is smaller than that realized after the color resin layer is exposed and developed. In the present invention, the black resin layer is positioned above the color resin layer and the photoresist layer, the black resin layer and the photoresist layer are exposed to form an exposure pattern, then the black resin layer, the photoresist layer and the color resin layer are developed sequentially according to the exposure pattern, the relatively small via holes are first formed on the black resin layer, and the via holes of which the size is similar to that of the via holes in the black resin layer are formed in the photoresist layer and the color resin layer. The hole size of the via holes formed through the method in the color resin layer is relatively small, so that the aperture ratio of pixels on the array substrate is improved.

In the present invention, the black resin layer has a light-shielding effect, the negative photoresist below the black resin layer has a light absorption effect, and most or all of light during exposure is absorbed by the black resin layer and the negative photoresist. Little or almost no light transmits the color resin layer, so that the color resin layer is not affected by the exposure light, or the influence of the light is low enough so that the color resin layer is not cured by the light; and when the color resin layer is developed, the color resin layer is not completely cured, so that the via holes with relatively small hole size may be formed in the color resin layer.

A preferred embodiment in the technical solution provided by embodiment 2 above will be specifically illustrated below on the aspect of process flow.

Figure 3:
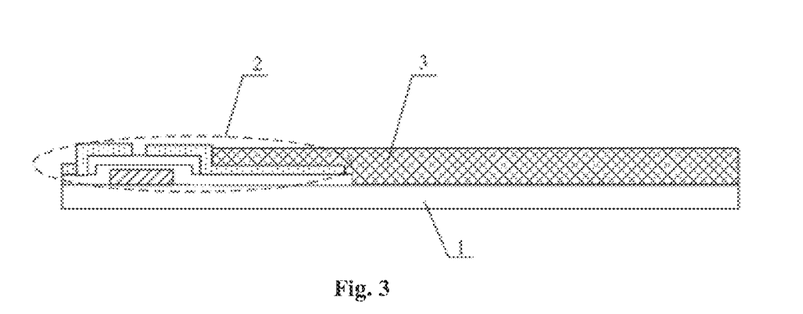
FIG. 3 is a structural schematic diagram of an array substrate on which a color resin layer is formed provided by embodiment 2 of the present invention.

Step 1:

See FIG. 3, thin film transistors 2 are formed on a substrate 1.

This process is similar to the prior art, for example, a bottom-gate or top-gate TFT is formed on a glass substrate, a resin substrate or a quartz substrate, and the TFT at least includes a gate, a gate insulating layer, an active layer, a source, a drain and the like. The drain is used for being electrically connected with a pixel electrode to be formed. According to the array substrate provided by the present invention, a color photoresist is positioned on the array substrate, that is, the color photoresist is positioned on the TFT, the pixel electrode is positioned on the color photoresist, and the pixel electrode is electrically connected with the drain through a via hole in the color photoresist.

Step 2:

See FIG. 3, a color resin layer 3 is formed on the substrate 1 on which the thin film transistors 2 are formed.

The color resin layer 3 may be a red resin layer, a green resin layer or a blue resin layer, which is respectively used as a red filter, a green filter or a blue filter to realize the filtering and display function of images. The color resin layer is a photoresist layer with certain pattern.

Figure 4:
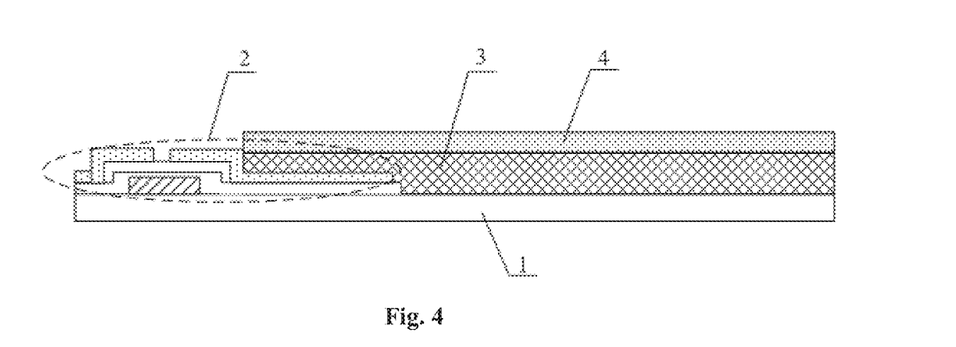
FIG. 4 is a structural schematic diagram of the array substrate on which a photoresist layer is formed provided by embodiment 2 of the present invention.

Step 3:

See FIG. 4, a photoresist layer 4 is formed on the substrate 1 on which the thin film transistors 2 and the color resin layer 3 are formed, and the photoresist layer 4 covers the color resin layer 3.

Preferably, the photoresist layer is a negative photoresist layer, and the area which is not irradiated by light may be developed off.

Figure 5:
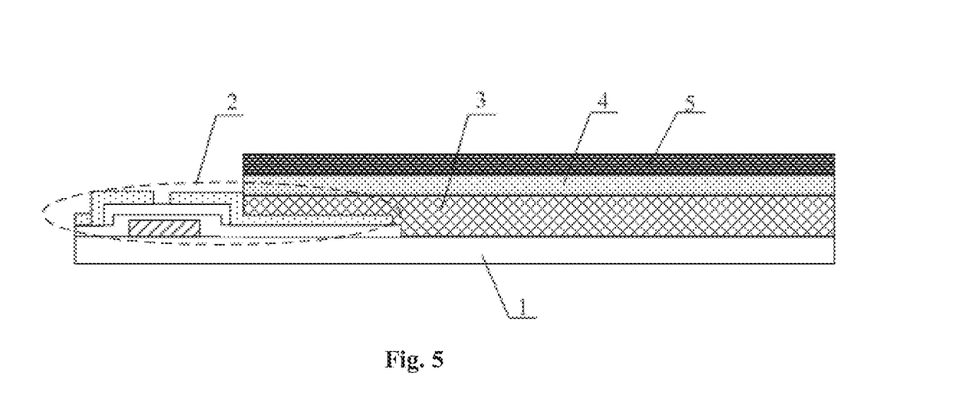
FIG. 5 is a structural schematic diagram of the array substrate on which a black resin layer is formed provided by embodiment 2 of the present invention.

Step 4:

See FIG. 5, a black resin layer 5 is formed on the substrate 1 on which the thin film transistors 2, the color resin layer 3 and the photoresist layer 4 are formed, and the black resin layer 5 covers the photoresist layer 4.

The black resin layer has a light-shielding effect, the area irradiated by light may not be developed off, and the area which is not irradiated by light may be developed off by using a developing solution.

Figure 6:
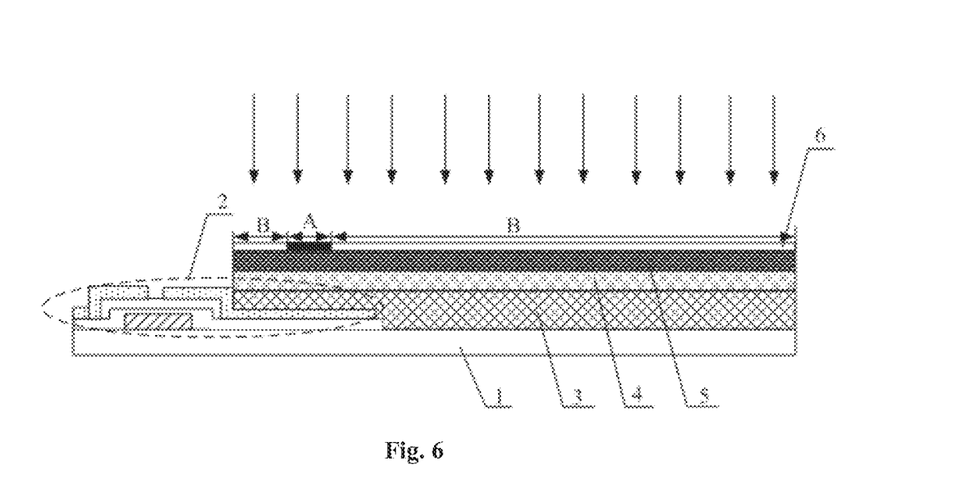
FIG. 6 is a structural schematic diagram of the array substrate on which a mask plate is placed provided by embodiment 2 of the present invention.

Step 5:

See FIG. 6, a mask plate 6 is placed on the black resin layer 5, wherein areas in which via holes are to be formed on the black resin layer 5 correspond to light-tight areas A of the mask plate 6, and the rest areas of the black resin layer corresponds to euphotic areas B of the mask plate;

the black resin layer 5 is exposed (line segments with arrows in FIG. 6 express light), then the black resin layer 5, the photoresist layer 4 and the color resin layer 3 are developed till the areas on the black resin layer 5, the photoresist layer 4 and the color resin layer 3 corresponding to the via holes to be formed are developed off, and thus the via holes penetrating the black resin layer 5, the photoresist layer 4 and the color resin layer 3 are formed.

Figure 7:
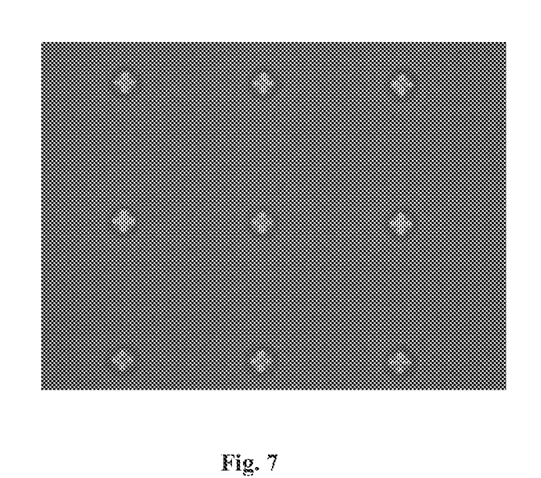
FIG. 7 is a structural schematic diagram of hole sizes not formed not under an exposure limit condition provided by embodiment 2 of the present invention.
Figure 8:
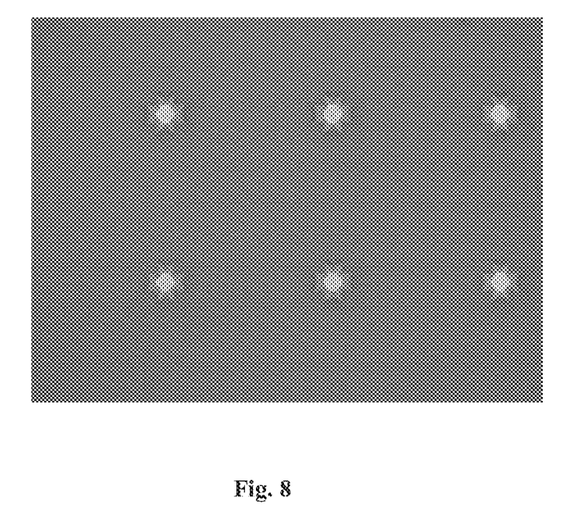
FIG. 8 is a structural schematic diagram of hole sizes formed under the exposure limit condition in the prior art.

The hole size of the via holes formed in the color resin layer through the manufacturing method for the array substrate provided by the embodiment of the present invention is relatively small. See FIG. 7, which shows that a hole size which is formed not under an exposure limit condition is about 12 μm. Under the exposure limit condition, namely the condition of the lowest exposure quantity and the longest development time, the formed hole size is smaller and is less than 12 μm. See FIG. 8, which shows a hole size formed under the exposure limit condition in the prior art. The hole size of the via holes formed under the exposure limit condition by adopting the method for forming the via holes in the prior art is at least 18 μm or more.

With continuous improvement of the resolution of a liquid crystal display, the size of each pixel unit of a display panel is smaller and smaller, for example, the size of each pixel unit of a display of which the resolution is 400 ppi is generally about 21*21 um. When the hole size of via holes is relatively large, holes can not be formed. Even if the resolution of the liquid crystal display is relatively low, for example, the size of each pixel unit of a display of which the resolution is 300 ppi is generally about 27*27 um, and when the hole size of via holes is relatively large, the aperture ratio of the pixel unit is also seriously affected. The manufacturing method for the array substrate provided by the embodiment of the present invention may realize the via holes of which the hole size is less than 12 μm, so that the aperture ratio of pixels on the array substrate is greatly improved.

Figure 9:
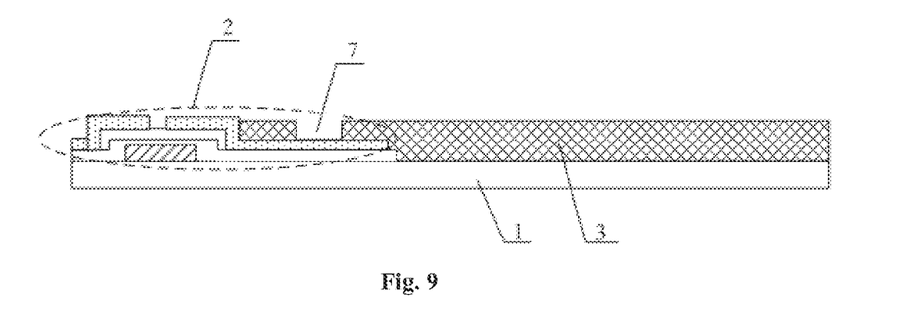
FIG. 9 is a structural schematic diagram of the array substrate in which via holes are formed in the color resin layer provided by embodiment 2 of the present invention.

Step 6:

See FIG. 9, all the black resin layer 5 and photoresist layer 4 and the rest color resin layer 3 are removed by adopting a peeling-off solution, and thus via holes 7 are formed in the color resin layer 3.

The negative photoresist may be peeled off by adopting the peeling-off solution, whereas the color resin layer and the black resin layer may not be peeled off by adopting the peeling-off solution, so that the negative photoresist may be peeled off through the peeling-off solution, and the black resin layer is removed together at the same time.

Step 7:

The above-mentioned substrate is exposed (by using a post-exposure device which is not provided with a mask, an alignment unit or the like, and only an ultraviolet irradiation unit and a housing are added on a conveying belt) without using a mask plate, and the color resin layer is hard-baked (post-baked) for further curing.

Figure 10:
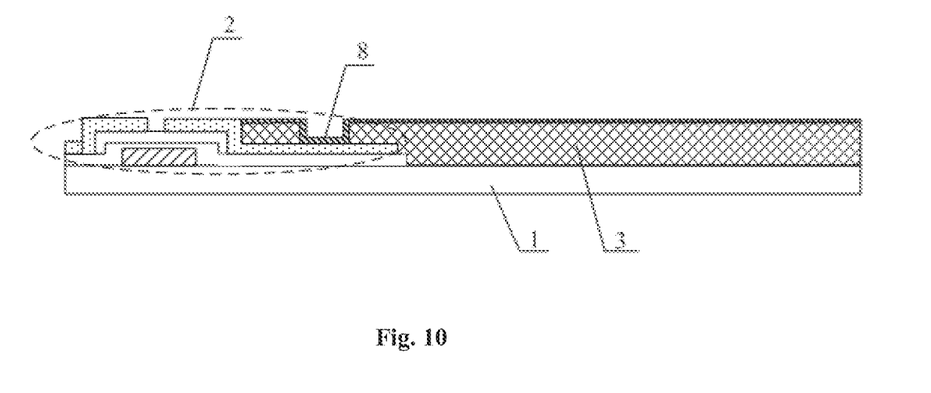
FIG. 10 is a structural schematic diagram of the array substrate on which pixel electrodes are formed provided by embodiment 2 of the present invention.

Step 8:

See FIG. 10, a plurality of pixel electrodes 8 are formed on the color resin layer 3 in which the via holes 7 are formed, wherein each pixel electrode 8 is connected with the drain electrode of the corresponding thin film transistor through the via hole 7 corresponding to the pixel electrode.

The embodiment of the present invention further provides an array substrate, which is manufactured by adopting the manufacturing method for the array substrate provided by the above-mentioned embodiment of the present invention.

The embodiment of the present invention further provides a display device, which includes the above-mentioned array substrate and may avoid the error in cell forming between the array substrate and a color filter substrate, so that the aperture ratio of pixels may be improved, the cost of a product may be reduced, and the display quality of the product may be improved.

In conclusion, the embodiments of the present invention provide the manufacturing method for the array substrate, that is, the thin film transistors are formed on the substrate; the color resin layer is formed on the substrate on which the thin film transistors are formed; then the black resin layer covering the whole substrate is formed on the substrate on which the thin film transistors and the color resin layer are formed; and the patterning process is performed at least on the black resin layer and the color resin layer to form the via holes penetrating through the black resin layer and the color resin layer. The present invention is proposed on the basis of the following facts, namely on the premise of identical exposure equipment and exposure parameters, the minimum critical dimension (CD) or hole size realized after the black resin layer is exposed and developed is smaller than that realized after the color resin layer is exposed and developed. In the present invention, the black resin layer is positioned on the color resin layer and is exposed to form an exposure pattern, the black resin layer and the color resin layer are developed sequentially according to the exposure pattern, relatively small via holes are first formed in the black resin layer, and the via holes of which the size is similar to that of the via holes in the black resin layer are formed in the color resin layer. The hole size of the via holes formed through the method in the color resin layer is relatively small, so that the aperture ratio of pixels on the array substrate is improved.

Obviously, various modifications and variations could be made to the present invention by those skilled in the art without departing from the spirit and scope of the present invention. Thus, provided that these modifications and variations made to the present invention are within the scope of the claims of the present invention and equivalent technologies thereof, the present invention is intended to cover these modifications and variations.

The invention claimed is:

1. A manufacturing method for an array substrate, comprising:
    forming thin film transistors on a substrate;
    forming a color resin layer on the substrate on which the thin film transistors are formed;
    forming a first light-blocking layer with a light-shielding effect on the color resin layer, the photolithographic resolution of the first light-blocking layer being greater than that of the color resin layer;
    performing a patterning process on the first light-blocking layer and the color resin layer to form via holes in the color resin layer;
    wherein the first light-blocking layer is a black resin layer.

2. The manufacturing method according to claim 1, wherein after the via holes are formed, the method further comprises:
    forming pixel electrodes on the color resin layer in which the via holes are formed, the pixel electrodes being connected with the drain electrodes of the thin film transistors via the corresponding via holes.

3. The manufacturing method according to claim 2, wherein after the via holes are formed on the color resin layer and before the pixel electrodes are formed, the method further comprises:
    removing the first light-blocking layer on the color resin layer through a dry etching method.

4. The manufacturing method according to claim 1, wherein after the color resin layer is formed on the substrate and before the first light-blocking layer is formed, the method further comprises:
    forming a second light-blocking layer which may be peeled off by adopting a peeling-off solution on the substrate on which the thin film transistors and the color resin layer are formed.

5. The manufacturing method according to claim 4, wherein the second light-blocking layer is a photoresist layer.

6. The manufacturing method according to claim 5, wherein the photoresist layer is a negative photoresist layer.

7. The manufacturing method according to claim 6, wherein after the via holes are formed on the color resin layer and before the pixel electrodes are formed, the method further comprises:
    peeling off the photoresist layer and the color resin layer by adopting the peeling-off solution.

8. The manufacturing method according to claim 1, wherein the step of sequentially performing the patterning process on the first light-blocking layer and the color resin layer to form the via holes in the color resin layer comprises:
    placing a mask plate on the first light-blocking layer, wherein areas in which the via holes are to be formed on the first light-blocking layer correspond to light-tight areas of the mask plate, and the rest areas of the first light-blocking layer correspond to euphotic areas of the mask plate; exposing the first light-blocking layer, and sequentially developing the first light-blocking layer and the color resin layer to develop the areas on the first light-blocking layer and the color resin layer corresponding to the via holes to be formed, thus forming the via holes penetrating through the first light-blocking layer and the color resin layer.

9. The manufacturing method according to claim 4, wherein the step of sequentially performing the patterning process on the first light-blocking layer and the color resin layer to form the via holes in the color resin layer comprises:

placing a mask plate on the first light-blocking layer, wherein areas in which the via holes are to be formed on the first light-blocking layer correspond to light-tight areas of the mask plate, and the rest areas of the first light-blocking layer correspond to euphotic areas of the mask plate; and     exposing the first light-blocking layer and the second photoresist layer, and sequentially developing the first light-blocking layer, the second light-blocking layer and the color resin layer till the areas on the first light-blocking layer, the second light-blocking layer and the color resin layer corresponding to the via holes to be formed are developed off, thus forming the via holes penetrating through the first light-blocking layer, the second light-blocking layer and the color resin layer.

10. An array substrate being manufactured by adopting the manufacturing method for array substrate according to claim 1.

11. A display device comprising the array substrate of claim 10.

\* \* \* \* \*